(12) United States Patent
Hsieh et al.

(10) Patent No.: US 8,980,506 B2
(45) Date of Patent: Mar. 17, 2015

(54) PHOTOSENSITIVE RESIN COMPOSITION AND APPLICATION THEREOF

(71) Applicant: Chi Mei Corporation, Tainan (TW)

(72) Inventors: I-Chun Hsieh, Tainan (TW); Hao-Wei Liao, Kaohsiung (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 13/956,373

(22) Filed: Aug. 1, 2013

(65) Prior Publication Data

US 2014/0051017 A1 Feb. 20, 2014

(30) Foreign Application Priority Data

Aug. 14, 2012 (TW) .............................. 101129391 A

(51) Int. Cl.
| | |
|---|---|
| G03F 7/023 | (2006.01) |
| G03F 7/028 | (2006.01) |
| G03F 7/031 | (2006.01) |
| G03F 7/033 | (2006.01) |
| G03F 7/00 | (2006.01) |
| G02B 1/10 | (2006.01) |
| G03F 7/022 | (2006.01) |
| G03F 7/40 | (2006.01) |

(52) U.S. Cl.
CPC .............. *G03F 7/0007* (2013.01); *G02B 1/105* (2013.01); *G03F 7/031* (2013.01); *G03F 7/028* (2013.01); *G03F 7/0226* (2013.01); *G03F 7/0233* (2013.01); *G03F 7/033* (2013.01); *G03F 7/40* (2013.01)

USPC ............. 430/18; 430/191; 430/192; 430/193; 430/281.1; 430/288.1

(58) Field of Classification Search
CPC ....... G03F 7/0233; G03F 7/028; G03F 7/031; G03F 7/033
USPC .............. 430/18, 191, 192, 193, 281.1, 288.1
See application file for complete search history.

(56) References Cited

U.S. PATENT DOCUMENTS 7,517,619 B2 * 4/2009 Hosaka et al. .................... 430/7

FOREIGN PATENT DOCUMENTS

| JP | 2004240241 A | 8/2004 |
|---|---|---|
| JP | 2010054561 A | 3/2010 |
| TW | 200413771 | 8/2004 |
| TW | 200413852 | 8/2004 |

* cited by examiner

*Primary Examiner* — John Chu
(74) *Attorney, Agent, or Firm* — CKC & Partners Co., Ltd.

(57) ABSTRACT

The present invention relates to a photosensitive resin composition, which comprises an alkali-soluble resin (A), a compound (B) containing vinyl unsaturated group(s), a photoinitiator (C), ortho-naphthoquinone diazide sulfonic acid ester (D), a thermal initiator (E) and a solvent (F). The photosensitive resin composition added with the ortho-naphthoquinone diazide sulfonic acid ester (D) and the thermal initiator (E) can have excellent resolution and development adherence. Moreover, the present invention further provides a spacer or a protective film formed by the aforementioned photosensitive resin composition, as well as a liquid crystal display device (LCD) including the aforementioned spacer or protective film.

12 Claims, No Drawings

PHOTOSENSITIVE RESIN COMPOSITION AND APPLICATION THEREOF

RELATED APPLICATIONS

This application claims priority to Taiwan Application Serial Number 101129391, filed on Aug. 14, 2012, which is herein incorporated by reference.

BACKGROUND

1. Field of Invention

The present invention relates to a photosensitive resin composition, a spacer or a protective film formed by the aforementioned photosensitive resin composition, and a liquid crystal display device (LCD) including the aforementioned spacer or protective film. More particularly, the present invention relates to a photosensitive resin composition having excellent resolution and development adherence, a spacer or a protective film formed by the aforementioned photosensitive resin composition, and a LCD including the aforementioned spacer or protective film.

2. Description of Related Art

In general, uneven surfaces generated from color-printed pixels and black matrixes on the surface of a color filter layer can be covered with a protective film thereon the surface of the color filter layer for planarization.

However, during manufacture of optical devices such as liquid crystal display devices or solid state imaging apparatus, there have to be treated by some processes under severe conditions. For example, a wiring electrode layer can be formed on a substrate surface by various methods of treating the substrate surface, for example, immersing the substrate surface into an acid solvent or alkaline solution, being sputtered on the substrate or the like. Such severe treatments can cause local corrosion or local high temperature. Therefore, it is necessary to cover protective films on the surfaces of these devices, so as to avoid the devices from being damaged during the manufacturing. In order to enable the protective film to resist damages of the aforementioned treatments, the protective film must have excellent adhesion to the substrate, as well as a surface with a high transparency, a high surface hardness and smoothness. Moreover, a protective film with high heat resistance and light resistance will not be deteriorated (such as color change, yellowing or whitening) after a long-time usage. Furthermore, it is also necessary for the protective film to have other characteristics such as good water resistance, chemical resistance, solvent resistance, acid resistance, alkaline resistance and the like.

Additionally, for the prior art, in a color LCD in order to maintain a constant layer distance (e.g. intercellular space) between two substrates, polystyrene beads or silica beads, for example, are randomly sprayed on the whole substrate, in which the diameters of these beads are equal to the distance between the two substrates. However, since those sprayed beads are uneven in their positions and distribution density by the prior methods, the light from the backlight source is scattered due to the influence of the sprayed beads, and thus the contrast ratio of the display devices are further reduced. For the aforementioned reasons, a photosensitive composition used for a spacer has been developed by photolithography and it has become the mainstream of the industry. At first, the photosensitive composition used for the spacer is coated onto the substrate, and then a light mask with a specific shape is placed between the substrate and an exposure source, followed by being exposed and developed, so that a spacer can be formed. Based on the aforementioned method, the spacer can be formed on given positions except R, G and B pixels, so as to solve the problem of the prior art. The cell gap can also be controlled by the thickness of the coated photosensitive composition, so that the distance of the cell gap can be easily controlled with the advantage of high precision.

Since the protective film or the spacer is formed on the color light filter or the substrate, the requirement for its transparency is extremely high. When such a protective film or spacer with poor transparency is used in the LCD, the brightness of the LCD will be insufficient, thereby affecting the display quality of the LCD.

In order to improve the transparency of the protective film or spacer, a photosensitive composition used for the protective film is disclosed in the Japanese Patent Laid-Open Publication No. 2010-054561, which includes an alkali-soluble binder resin (A); a compound (B) containing vinyl unsaturated group(s); a photoinitiator (C); and a solvent (D). The combination equivalent weight of the unsaturated bonds in the compound (B) containing vinyl unsaturated group(s) is 90 to 450 g/eq, the number of unsaturated double bonds in one molecule of the compound (B) containing vinyl unsaturated group(s) is 2 to 4, and the weight-average molecular weight of the alkali-soluble binder resin (A) is 10,000 to 20,000. Additionally, a photosensitive composition is disclosed in the Japanese Patent Laid-Open Publication No. 2004-240241, which includes (A) a copolymer (A) of an ethylenically unsaturated carboxylic acid (anhydride), an ethylenically unsaturated compound containing an epoxy group(s), and other ethylenically unsaturated compounds; (B) a polymerizable compound having an ethylenically unsaturated group(s); and (C) a photopolymerization initiator represented by 2-butanedione-[4-(methylthio)phenyl]-2-(O-oxime acetate), 1,2-butanedione-1-(4-morpholinylphenyl)-2-(O-benzoyloxime), 1,2-octanedione-1-[4-(phenylthio)phenyl]-2-[O-(4-methylbenzoyl)oxime] or the like. However, although such a photosensitive composition can be used to manufacture a protective film or spacer with high transparency, the photosensitive composition has disadvantages of poor resolution and development adherence.

Accordingly, it is necessary to develop a photosensitive resin composition used for a spacer or protective film with excellent resolution and development adherence, so as to solve various aforementioned problems of the conventional protective film or spacer.

SUMMARY

Therefore, an aspect of the present invention provides a photosensitive resin composition, which comprises an alkali-soluble resin (A), a compound (B) containing vinyl unsaturated group(s), a photoinitiator (C), ortho-naphthoquinone diazide sulfonic acid ester (D), a thermal initiator (E) and a solvent (F).

Another aspect of the present invention provides a spacer, which has a pattern and is formed by subjecting the aforementioned photosensitive resin composition to sequentially pre-baking, exposing, developing and post-baking steps.

A further aspect of the present invention provides a protective film, which has a pattern and is formed by subjecting the aforementioned photosensitive resin composition to sequentially pre-baking, exposing, developing and post-baking steps.

Yet a further aspect of the present invention provides a LCD device, which includes the aforementioned spacer or protective film, so as to improve the disadvantages of the prior spacer or protective film with poor resolution and development adherence manufactured from conventional photosensitive resin compositions.

The photosensitive resin composition of the present invention includes an alkali-soluble resin (A), a compound (B) containing vinyl unsaturated group(s), a photoinitiator (C), ortho-naphthoquinone diazide sulfonic acid ester (D), a thermal initiator (E) and a solvent (F), which are described in details as follows.

It only should be noted that in the present invention, (meth) acrylic acid represents acrylic acid and/or methacrylic acid; similarly (meth)acrylic ester represents acrylic ester and/or methacrylate ester; and (meth)acryloyl represents acryloyl and/or methacryl.

Alkali-Soluble Resin (A)

The alkali-soluble resin (A) of the present invention refers to a resin that can be soluble in an alkaline aqueous solution without being limited to any specific structure. In a preferred embodiment of the present invention, the alkali-soluble resin (A) refers to a resin including a carboxylic group, a phenolnovolac resin and the like. Preferably, the alkali-soluble resin (A) is copolymerized from a compound (a1) of unsaturated carboxylic acid or unsaturated carboxylic anhydride, an unsaturated compound containing epoxy group(s) (a2) and/or other unsaturated compounds (a3) in a solvent in the presence of an appropriate polymerization initiator.

1. Compound (a1) of Unsaturated Carboxylic Acid or Unsaturated Carboxylic Anhydride The aforementioned compound (a1) of unsaturated carboxylic acid or unsaturated carboxylic anhydride refers to a compound containing the structure of carboxylic acid or carboxylic anhydride and unsaturated polymerizable bonds without being limited to any specific structure. The compound includes but is not limited to an unsaturated monocarboxylic acid compound, an unsaturated dicarboxylic acid compound, an unsaturated acid anhydride compound, an unsaturated polycyclic carboxylic acid compound, an unsaturated polycyclic dicarboxylic acid compound and an unsaturated polycyclic acid anhydride compound.

Specific examples of the aforementioned unsaturated monocarboxylic acid compound are as below: (meth)acrylic acid, butenoic acid, α-chloracrylic acid, ethyl acrylate, cinnamic acid, 2-(meth)acryloyloxyethyl succinate monoester, 2-(meth)acryloyloxyethyl hexahydrophthalic acid ester, 2-(meth)acryloyloxyethyl phthalic acid ester and omega-carboxyl polycaprolactone polyol monoacrylate (trade name of ARONIX M-5300, manufactured by Toagosei Co., Ltd.). Specific examples of the aforementioned unsaturated dicarboxylic acid compound are as below: maleic acid, fumaric acid, mesaconic acid, itaconic acid and traconic acid. In an example of the present invention, the unsaturated dicarboxylic acid anhydride compound is the anhydride compound of the aforementioned unsaturated dicarboxylic acid compound. The specific examples of the aforementioned unsaturated polycyclic carboxylic acid compound are as below: 5-carboxyl bicyclo[2.2.1]hept-2-ene, 5-carboxyl-5-methylbicyclo[2.2.1]hept-2-ene, 5-carboxyl-5-ethylbicyclo[2.2.1]hept-2-ene, 5-carboxyl-6-methylbicyclo[2.2.1]hept-2-ene and 5-carboxyl-6-ethylbicyclo[2.2.1]hept-2-ene. The specific examples of the aforementioned unsaturated polycyclic dicarboxylic acid compound are as below: 5,6-dicarboxylic bicyclo[2.2.1]hept-2-ene. The aforementioned unsaturated polycyclic dicarboxylic acid anhydride compound is the anhydride compound of the aforementioned unsaturated polycyclic dicarboxylic acid compound.

The preferred examples of the aforementioned compound (a1) of unsaturated carboxylic acid or unsaturated carboxylic anhydride are acrylic acid, methacrylic acid, maleic anhydride, 2-methacryloyloxyethyl succinate monoester and 2-methacryloyloxyethyl hexahydrophthalic acid.

The compound (a1) of unsaturated carboxylic acid or unsaturated carboxylic anhydride can be used separately or with a mixture of a plurality of compounds (a1). Based on a total amount of the compound (a1) of unsaturated carboxylic acid or unsaturated carboxylic anhydride, the unsaturated compound containing epoxy group(s) (a2) and other unsaturated compounds (a3) as 100 parts by weight, preferably the amount of the compound (a1) of unsaturated carboxylic acid or unsaturated carboxylic anhydride is 5 to 50 parts by weight.

2. Unsaturated Compound Containing Epoxy Group(s) (a2)

The aforementioned unsaturated compound containing epoxy group(s) (a2) may include but be not limited to (meth) acrylic ester compounds containing epoxy group(s), α-alkyl acrylate compounds containing epoxy group(s) and epoxypropyl ether compounds.

Specific examples of the aforementioned (meth)acrylic ester compounds containing epoxy group(s) are as below: glycidyl (meth)acrylate, 2-methylglycidyl (meth)acrylate, 3,4-epoxybutyl (meth)acrylate, 6,7-epoxyheptyl (meth)acrylate, 3,4-epoxycyclohexyl (meth)acrylate and 3,4-epoxycyclohexylmethyl (meth)acrylate. Specific examples of the aforementioned α-alkyl acrylate compounds containing epoxy group(s) are as below: glycidyl α-ethacrylate, glycidyl α-n-propylacrylate, glycidyl α-n-butylacrylate and 6,7-epoxyheptyl α-ethacrylate. Specific examples of the aforementioned epoxypropyl ether compounds are as below: o-vinylbenzylglycidylether, m-vinylbenzylglycidylether and p-vinylbenzylglycidylether. The preferred examples of the aforementioned unsaturated compound containing epoxy group(s) (a2) are as below: glycidyl methacylate, 3,4-epoxycyclohexylmethyl (meth)acrylate, 6,7-epoxyheptyl acrylate, O-vinylbenzylglycidylether, m-vinylbenzylglycidylether and p-vinylbenzylglycidylether.

The aforementioned unsaturated compound containing epoxy group(s) (a2) can be used separately or with a mixture of a plurality of the compounds (a2). Based on a total amount of the compound (a1) of unsaturated carboxylic acid or unsaturated carboxylic anhydride, the unsaturated compound containing epoxy group(s) (a2) and other unsaturated compounds (a3) as 100 parts by weight, preferably the amount of the unsaturated compound containing epoxy group(s) (a2) is 10 parts by weight to 70 parts by weight.

3. Other Unsaturated Compounds (a3)

The aforementioned other unsaturated compounds (a3) may include but be not limited to alkyl (meth)acrylate, alicyclic (meth)acrylate, aryl (meth)acrylate, unsaturated dicarboxylic diester, hydroxyalkyl (meth)acrylate, polyether of (meth)acrylic esters, aromatic vinyl compounds and other unsaturated compounds except the aforementioned unsaturated compounds.

The specific examples of the aforementioned alkyl (meth) acrylate are as below: methyl (meth)acrylate, ethyl (meth) acrylate, n-propyl (meth)acrylate, isopropyl (meth)acrylate, n-butyl (meth)acrylate, iso-butyl (meth)acrylate, sec-butyl (meth)acrylate and tert-butyl (meth)acrylate. The specific examples of the aforementioned alicyclic (meth)acrylate are as below: cyclohexyl (meth)acrylate, 2-methylcyclohexyl (meth)acrylate, tricyclic[$5.2.1.0^{2,6}$]deca-8-yl (meth)acrylic ester (or referred to as dicyclopentanyl (meth)acrylate), dicyclopentyloxyethyl (meth)acrylate, isobornyl (meth)acrylate and tetrahydrofuranyl (meth)acrylate. The specific examples of the aforementioned aryl (meth)acrylate are as below: phenyl (meth)acrylate and benzyl (meth)acrylate. The specific examples of the aforementioned unsaturated dicarboxylic diester are as below: diethyl maleate, diethyl fumarate and diethyl itaconate. The specific examples of the aforementioned hydroxyalkyl (meth)acrylate are as below: 2-hydroxyethyl (meth)acrylate and 2-hydroxypropyl (meth)acrylate. The specific examples of the aforementioned polyether of (meth)acrylic esters areas below: polyglycol mono(meth)acrylate and polypropylene glycol mono(meth)acrylate. The specific examples of the aforementioned aromatic vinyl compounds are as below: styrene monomer, α-methylstyrene, m-methylstyrene, p-methylstyrene and p-methoxy styrene. The specific examples of the aforementioned other unsaturated compounds are as below: acrylonitrile, methacrylonitrile, chloroethylene, vinylidene chloride, acrylamide, methacrylamide, vinyl acetate, 1,3-butadiene, isoprene, 2,3-dimethyl 1,3-butadiene, N-cyclohexyl maleimide, N-phenyl maleimide, N-benzyl maleimide, N-succinimide-3-maleimidobenzoic ester, N-succimide-4-maleimidobutyric ester, N-succinimide-6-maleimidocaproate, N-succinimide-3-maleimido propionic ester and N-(9-acridinyl) maleimide.

The preferred examples of the aforementioned other unsaturated compounds (a3) are as below: methyl (meth)acrylate, butyl (meth)acrylate, 2-hydroxyethyl (meth)acrylate, tert-butyl (meth)acrylate, benzyl (meth)acrylate, dicyclopentanyl (meth)acrylate, dicyclopentyloxyethyl (meth)acrylate, styrene monomer and p-methoxy styrene.

The aforementioned other unsaturated compounds (a3) can be used separately or with a mixture of a plurality of the compounds (a3). Based on a total amount of the compound (a1) of unsaturated carboxylic acid or unsaturated carboxylic anhydride, the unsaturated compound containing epoxy group(s) (a2) and other unsaturated compounds (a3) as 100 parts by weight, preferably the amount of the other unsaturated compounds (a3) is 0 parts by weight to 70 parts by weight.

During manufacturing, the solvent used for the alkali-soluble resin (A) of the present invention may include but be not limited to alcohol, ether, glycol ether, glycolalkyl ether acetate, diethylene glycol, dipropylene glycol, propylene glycol monoalkyl ether, propylene glycol monoalkyl ether acetate, propylene glycol monoalkyl ether propionate, aromatic hydrocarbon, ketone and ester.

The specific examples of the aforementioned alcohol are as below: methanol, ethanol, phenylcarbinol, 2-phenylethanol and 3-phenyl-1-propanol. The specific example of the aforementioned ether is tetrahydrofuran. The specific examples of the aforementioned glycol ether are as below: ethylene glycol monopropyl ether, ethylene glycol monomethyl ether and ethylene glycol monoethyl ether. The specific examples of the aforementioned glycolalkyl ether acetate are as below: glycol monobutyl ether acetate, glycol ether acetate and glycol monomethyl ether acetate. The specific examples of the aforementioned diethylene glycol are as below: diethylene glycol monomethyl ether, diethylene glycol monoethyl ether, diethylene glycol monobutyl ether, diethylene glycol dimethyl ether, diethylene glycol diethyl ether, diethylene glycol ethyl methyl ether. The specific examples of the aforementioned dipropylene glycol are as below: dipropylene glycol monomethyl ether, dipropylene glycol monoethyl ether, dipropylene glycol dimethyl ether, dipropylene glycol diethyl ether and dipropylene glycol ethyl methyl ether. The specific examples of the aforementioned propylene glycol monoalkyl ether are as below: propylene glycol monomethyl ether, propylene glycol monoethyl ether, propylene glycol monopropyl ether and propylene glycol monobutyl ether. The specific examples of the aforementioned propylene glycol monoalkyl ether propionate are as below: propylene glycol monomethyl ether acetate, propylene glycol ethyl ether acetate, propylene glycol propyl ether acetate and propylene glycol butyl ether acetate. The specific examples of the aforementioned propylene glycol monoalkyl ether propionate are as below: propylene glycol monomethyl ether propionate, propylene glycol ethyl ether propionate, propylene glycol propyl ether propionate and propylene glycol butyl ether propionate. The specific examples of the aforementioned aromatic hydrocarbon are as below: methylbenzene and dimethylbenzene. The specific examples of the aforementioned ketone are as below: ethyl methyl ketone, cyclohexanone and diacetone alcohol. The specific examples of the aforementioned ester are as below: methyl acetate, ethyl acetate, propyl acetate, butyl acetate, ethyl 2-hydroxypropionate, methyl 2-hydroxy-2-methpropionate, ethyl 2-hydroxy-2-methpropionate, methyl glycolate, ethyl glycolate, butyl glycolate, methyl lactate, propyl lactate, butyl lactate, methyl 3-hydroxypropionate, ethyl 3-hydroxypropionate, butyl 3-hydroxypropionate, methyl 2-hydroxy-3-methbutyrate, methyl methoxylacetate, ethyl methoxylacetate, butyl methoxylacetate, methyl ethoxylacetate, ethyl ethoxylacetate, propyl ethoxylacetate, butyl ethoxylacetate, methyl propoxylacetate, ethyl propoxylacetate, propyl propoxylacetate, butyl propoxylacetate, methyl butoxyacetate, ethyl butoxyacetate, propyl butoxyacetate, butyl butoxyacetate, 3-methoxylbutyl acetate, methyl 2-methoxylpropionate, ethyl 2-methoxylpropionate, propyl 2-methoxylpropionate, butyl 2-methoxylpropionate, methyl 2-ethoxylpropionate, ethyl 2-ethoxylpropionate, propyl 2-ethoxylpropionate, butyl 2-ethoxylpropionate, methyl 2-butoxypropionate, ethyl 2-butoxypropionate, propyl 2-butoxypropionate, butyl 2-butoxypropionate, methyl 3-methoxylpropionate, ethyl 3-methoxylpropionate, propyl 3-methoxylpropionate, butyl 3-methoxylpropionate, methyl 3-ethoxylpropionate, ethyl 3-ethoxylpropionate, propyl 3-ethoxylpropionate, butyl 3-ethoxylpropionate, methyl 3-propoxylpropionate, ethyl 3-propoxylpropionate, propyl 3-propoxylpropionate, butyl 3-propoxylpropionate, methyl 3-butoxypropionate, ethyl 3-butoxypropionate, propyl 3-butoxypropionate and butyl 3-butoxypropionate.

The preferred examples of the solvent used for the alkali-soluble resin (A) of the present invention during manufacturing are as below: diethylene glycol dimethyl ether and propylene glycol monomethyl ether acetate. The aforementioned solvent can be used separately or with a mixture of a plurality of the solvents.

The specific examples Pfizer the polymerizing initiator used for the is alkali-soluble resin (A) of the present invention during manufacturing are azo compounds or peroxides. The specific examples of the aforementioned azo compounds are as below: 2,2'-azobis(isobutyronitrile), 2,2'-azobis(2,4-dimethylvaleronitrile), 2,2'-azobis(4-methoxyl-2,4-dimethylvaleronitrile), 2,2'-azobis(2-methyl butyronitrile), 4,4'-azobis(4-cyano valeric acid) and 2,2'-azobis(dimethyl-2-methylpropionate). The specific examples of the aforementioned peroxides are as below: dibenzoyl peroxide, dilauroyl peroxide, tert-butyl peroxypivalate, 1,1-di(tert-butylperoxy)cyclohexane and hydrogen peroxide. The aforementioned polymerizing initiator can be used separately or with a mixture of a plurality of the polymerizing initiators.

The weight average module weight of the alkali-soluble resin (A) of the present invention is generally 3,000 to 100,000, preferably 4,000 to 80,000, and more preferably 5,000 to 60,000.

The molecular weight of the alkali-soluble resin (A) of the present invention can be adjusted by using a single resin or using two or more resins with different molecular weights synergistically.

Compound (B) Containing Vinyl Unsaturated Group(s)

The compound (B) containing vinyl unsaturated group(s) of the present invention refers to a compound containing at least one vinyl unsaturated group.

In the examples of the present invention, the compounds containing one vinyl unsaturated group are as below: acrylamide, (meth)acryloyl morpholine, 7-amino-3,7-dimethyloctylamine (meth)acrylate, isobutoxymethyl (meth)acrylamide, isobornyloxyethyl (meth)acrylate, isobornyl (meth)acrylate, 2-ethylhexyl (meth)acrylate, ethyl diethylene glycol (meth)acrylate, tert-octyl (meth)acrylamide, dipropyl ketone (meth)acrylamide, dimethylamino (meth)acrylate, dodecyl (meth)acrylate, dicyclopentenyloxyethyl (meth)acrylate, dicyclopentenyl (meth)acrylate, N,N-dimethyl (meth)acrylamide, tetrachlorobenzene (meth)acrylate, 2-tetrachlorophenoxylethyl (meth)acrylate, tetrahydrofurfuryl (meth)acrylate, tetrabromobenzene (meth)acrylate, 2-tetrabromophenoxylethyl (meth)acrylate, trichlorophenoxylethyl (meth)acrylate, tribromobenzene (meth)acrylate, 2-tribromophenoxylethyl (meth)acrylate, 2-ethoxyl (meth)acrylate, 2-hydroxypropyl (meth)acrylate, vinylcaprolactam, N-vinyl pyrrolidone, phenoxyethyl (meth)acrylate, pentachlorobenzene (meth)acrylate, pentabromobenzene (meth)acrylate, glycerol polymono(meth)acrylate, propanediol polymono(meth)acrylate, borneol (meth)acrylate, diethylene glycol monoethyl ether (meth)acrylate, butyl 3-methoxyl (meth)acrylate, 2-(meth)acryloyloxyethyl-2-hydroxypropyl phthalate ester, omega-carboxypolycaprolactone monoacrylate, ARONIX M-101, M-111, M-114 and M-5300 (manufactured by Toagosei Co., Ltd), KAYARAD TC-110S and TC-120S (manufactured by Nippon Kayaku), Viscoat 158 and 2311 (manufactured by Osaka Organic Chemical Industry Ltd.).

In the examples of the present invention, the compounds containing two or more vinyl unsaturated groups are as below: diethylene glycol di(meth)acrylate, dicyclopentene di(meth)acrylate, triethylene glycol diacrylate, tetraethylene glycol di(meth)acrylate, tri(2-ethoxyl)isocyanate di(meth)acrylate, tri(2-ethoxyl)isocyanate tri(meth)acrylate, caprolactone modified tri(2-ethoxyl)isocyanate tri(meth)acrylate, trihydroxymethylpropyl tri(meth)acrylate, ethylene oxide (hereinafter abbreviated as EO) modified trihydroxymethylpropyl tri(meth)acrylate, propylene oxide (hereinafter abbreviated as PO) modified trihydroxymethylpropyl tri(meth)acrylate, triglycol di(meth)acrylate, neopentyl glycol di(meth)acrylate, 1,4-butanediol di(meth)acrylate, 1,6-hexanediol di(meth)acrylate, 1,9-nonanediol di(meth)acrylate, di(alcoholphenoxyl)fluorine di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, EO modified dipentaerythritol hexa(meth)acrylate, EO modified dipentaerythritol penta(meth)acrylate, bistrimethylolpropyl tetra(meth)acrylate, EO modified bisphenol A di(meth)acrylate, PO modified bisphenol A di(meth)acrylate, EO modified hydrogenated bisphenol A di(meth)acrylate, PO modified hydrogenated bisphenol A di(meth)acrylate, PO modified glycerol triacrylate, EO modified bisphenol F di(meth)acrylate, phenolic polyglycidyl ether (meth)acrylate, tri(2-(meth)acryloyloxyethyl) phosphate ARONIX M-210, M-240, M-6200, M-309, M-400, M-405, M-450, M-7100, M-8030 and M-8060; TO-1450 (manufactured by Toagosei Co., Ltd.), KAYARAD HDDA, HX-220, R-604, DPHA, TMPTA, DPCA-20, DPCA-30, DPCA-60, DPCA-120 (manufactured by Nippon Kayaku), Viscoat 260, 312, 335H.P., 295, 300, 360, GPT, 3PA, 400 (manufactured by Osaka Organic Chemical Industry Ltd.).

The compound containing nine or more vinyl unsaturated groups is: a compound having a structure of ethylene straight chain and cycloaliphatic ring, such as a polyurethane acrylate polymerized from a compound containing more than two isocyanate groups and a (meth)acrylate compound which has one or more hydroxyl groups and three, four or five functional groups per molecular. The specific examples of the compound are New frontier R-1150 (manufactured by Daiichi Sankyo Co., Ltd.) and KAYARAD DPHA-40H (manufactured by Nippon Kayaku).

Preferably, the compound (B) containing the vinyl unsaturated groups is trimethylolpropane triacrylate, caprolactone modified trimethylolpropane triacrylate, PO modified trimethylolpropane triacrylate, pentaerythritol triacrylate, pentaerythritol tetraacrylate, dipentaerythritol hexaacrylate, dipentaerythritol pentaacrylate, dipentaerythritol tetraacrylate, caprolactone modified dipentaerythritol hexaacrylate, bistrimethylolpropyl tetra(meth)acrylate, PO modified glycerol triacrylate. These compound (B) containing the vinyl unsaturated groups can be used separately or with a mixture of a plurality of the compounds (B).

The amount of the compound (B) containing the vinyl unsaturated group(s) of the present invention can be adjusted according to requirements. In an example of the present invention, based on the amount of the alkali-soluble resin (A) as 100 parts by weight, the amount of the compound (B) containing the vinyl unsaturated group(s) of the present invention is 20 parts by weight to 200 parts by weight, preferably 25 parts by weight to 190 parts by weight, and more preferably 30 parts by weight to 180 parts by weight.

Photoinitiator (C)

The photoinitiator (C) of the present invention is subjected to no specific limitation, and in an example of the present invention the photoinitiator (C) includes O-acyloxime photoinitiators, triazine photoinitiators, acetophenone compounds, biimidazole compounds, benzophenone compounds, α-diketone compounds, ketol compounds, ketol ether compounds, acyl phosphine oxide compounds, quinone compounds, compounds containing halogens and peroxides.

The specific examples of the aforementioned O-acyloxime photoinitiators are 1-[4-(phenylthio)phenyl]-heptane-1,2-diketone 2-(O-benzoyloxime), 1-[4-(phenylthio)phenyl]-octane-1,2-diketone 2-(O-benzoyloxime), 1-[4-(benzoyl)phenyl]-heptane-1,2-diketone 2-(O-benzoyloxime), 1-[9-ethyl-6-(2-methylbenzoyl)-9H-carbazole-3-yl]-ethyl ketone 1-(O-acetaldoxime), 1-[9-ethyl-6-(3-methylbenzoyl)-9H-carbazole-3-yl]-ethyl ketone 1-(O-acetaldoxime), 1-[9-ethyl-6-benzoyl-9H-carbazole-3-yl]-ethyl ketone 1-(O-acetaldoxime), ethyl ketone-1-[9-ethyl-6-(2-methyl-4-tetrahydrofuranylbenzoyl)-9H-carbazole-3-yl]-1-(O-acetaldoxime), ethyl ketone-1-[9-ethyl-6-(2-methyl-4-tetrahydropyranylbenzoyl)-9H-carbazole-3-yl]-1-(O-acetaldoxime), ethyl ketone-1-[9-ethyl-6-(2-methyl-5-tetrahydrofuranylbenzoyl)-9H-carbazole-3-yl]-1-(O-acetaldoxime), ethyl ketone-1-[9-ethyl-6-(2-methyl-5-tetrahydropyranylbenzoyl)-9H-carbazole-3-yl]-1-(O-acetaldoxime), ethyl ketone-1-[9-ethyl-6-(2-methyl-4-methoxyltetrahydrofuranylmethoxybenzoyl)-9H-carbazole-3-yl]-1-(O-acetaldoxime), ethyl ketone-1-[9-ethyl-6-(2-methyl-4-methoxyltetrahydropyranylmethoxybenzoyl)-9H-carbazole-3-yl]-1-(O-acetaldoxime), ethyl ketone-1-[9-ethyl-6-(2-methyl-5-methoxytetrahydrofuranylmethoxybenzoyl)- 9H-carbazole- 3-yl]-1-(O-acetaldoxime), ethyl ketone-1-[9-ethyl-6-(2-methyl-5-methoxyltetrahydropyranylmethoxybenzoyl)-9H-carbazole-3-yl]-1-(O-acetaldoxime), ethyl ketone-1-[9-ethyl-6-{2-methyl-4-(2,2-dimethyl-1,3-dioxolan)benzoyl}-9H-carbazole-3-yl]-1-(o-acetaldoxime) and ethyl ketone-1-[9-ethyl-6-{2-methyl-4-(2,2-dimethyl-1,3-dioxolan) methoxylbenzoyl}-9H-carbazole-3-yl]-1-(O-acetaldoxime).

The aforementioned O-acyloxime photoinitiators can be used separately or with a mixture of a plurality of the O-acyloxime photoinitiators. The aforementioned O-acyloxime photoinitiator is preferably 1-[4-(phenylthio)phenyl]-octane-1,2-diketone 2-(o-benzoylbenzoyloxime), 1-[9-ethyl-(2-benzoylmethybenzoyl)-9H-cabazole-3-yl]-ethyl ketone 1-(O-acetaldoxime), ethyl ketone-1-[9-ethyl-6-(2-methyl-4-tetrahydrofuranmethoxylbenzoyl)-9H-carbazole-3-yl]-1-(O-acetaldoxime) and ethyl ketone-1-[9-ethyl-6-{2-methyl-4-(2,2-dimethyl-1,3-dioxolan)methoxylbenzoyl}-9H-carbazole-3-yl]-1-(O-acetaldoxime).

The specific examples of the triazine photoinitiator of the present invention are as below: vinyl-halomethyl-s-triazine compounds, 2-(naphtho-1-yl)-4,6-bis-halomethyl-s-triazine compounds and 4-(p-aminophenyl)-2,6-bis-halomethyl-s-triazine compounds.

The specific examples of the vinyl-halomethyl-s-triazine compound areas below: 2,4-bis(trichloromethyl)-6-p-methoxylmethoxy styrene-s-triazine, 2,4-bis(trichloromethyl)-3-(1-p-dimethylaminophenyl-1,3-bivinyl)-s-triazine and 2-trichloromethyl-3-amino-6-p-methoxylmethoxy styrene-s-triazine.

The specific examples of the 2-(naphtho-1-yl)-4,6-bis-halomethyl-s-triazine compound are as below: 2-(naphtho-1-yl)-4,6-bis-trichloromethyl-s-triazine, 2-(4-methoxyl-methoxyl-naphtho-1-yl)-4,6-bis-trichloromethyl-s-triazine, 2-(4-ethoxyl-naphtho-1-yl)-4,6-bis-trichloromethyl-s-triazine, 2-(4-butoxy-naphtho-1-yl)-4,6-bis-trichloromethyl-s-triazine, 2-[4-(2-methoxyl ethylmethoxyl)-naphtho-1-yl]-4,6-bis-trichloromethyl-s-triazine, 2-[4-(2-ethoxy]ethyl)-naphtho-1-yl-4,6-bis-trichloromethyl-s-triazine, 2-[4-(2-butoxylethyl)-naphtho-1-yl]-4,6-bis-trichloromethyl-s-triazine, 2-(2-methoxyl-naphtho-1-yl)-4,6-bis-trichloromethyl-s-triazine, 2-(6-methoxyl-5-methyl-naphtho-2-yl)-4,6-bis-trichloromethyl-s-triazine, 2-(6-methoxyl-naphtho-2-yl)-4,6-bis-trichloromethyl-s-triazine, 2-(5-methoxyl-naphtho-1-yl)-4,6-bis-trichloromethyl-s-triazine, 2-(4,7-dimethoxyl-naphtho-1-yl)-4,6-bis-trichloromethyl-s-triazine and 2-(4,5-dimethoxyl-naphtho-1-yl)-4,6-bis-trichloromethyl-s-triazine.

The specific examples of the 4-(p-aminophenyl)-2,6-dihalomethyl-s-triazine are as below: 4-[p-N,N-di(carbonylethoxycarbonylmethyl)aminophenyl]-2,6-bis(trichloromethyl)-s-triazine, 4-[o-methyl-p-N,N-di(carbonylethoxycarbonylmethyl)aminophenyl]-2,6-bis(trichloromethyl)-s-triazine, 4-[p-N,N-di(chloroethyl)aminophenyl]-2,6-bis(trichloromethyl)-s-triazine, 4-[o-methyl-p-N,N-di(chloroethy)aminophenyl]-2,6-bis(trichloromethyl)-s-triazine, 4-(p-N-chloroethylaminophenyl)-2,6-bis(trichloromethyl)-s-triazine, 4-(p-N-carbonylethoxycarbonylmethylaminophenyl)-2,6-bis(trichloromethyl)-s-tri azine, 4-[p-N,N-di(phenyl)aminophenyl]-2,6-bis(trichloromethyl)-s-triazine, 4-(p-N-chloroethylcarbonylaminophenyl)-2,6-bis(trichloromethyl)-s-triazine, 4-[p-N-(p-methoxyphenyl)carbonylaminophenyl]-2,6-bis(trichloromethyl)-s-triazine, 4-[m-N,N-di(carbonylethoxycarbonylmethyl)aminophenyl]-2,6-bis(trichloromethyl 4)-s-triazine, 4-[m-bromo-p-N,N- di(carbonylethoxycarbonylmethyl)aminophenyl]-2,6-bis(trichloromethyl)-s-triazine, 4-[m-chloro-p-N,N-di(carbonylethoxycarbonylmethyl)aminophenyl]-2,6-bis(trichloromethyl)-s-triazine, 4-[m-fluoro-p-N,N-di(carbonylethoxycarbonylmethyl)aminophenyl]-2,6-bis(trichloromethyl)-s-triazine, 4-[o-bromo-p-N,N-di(carbonylethoxycarbonylmethyl)aminophenyl]-2,6-bis(trichloromethyl)-s-triazine, 4-[o-chloro-p-N,N-di(carbonylethoxycarbonylmethyl)aminophenyl-2,6-bis(trichloromethyl)-s-triazine, 4-o-fluoro-p-N,N-di(carbonylethoxycarbonylmethyl)aminophenyl-2,6-bis(trichloromethyl)-s-triazine, 4-[o-bromo-p-N,N-di(chloroethyl)aminophenyl]-2,6-bis(trichloromethyl)-s-triazine, 4-[o-chlor-P—N,N-di(chloroethyl)aminophenyl]-2,6-bis(trichloromethyl)-s-triazine, 4-[o-fluoro-p-N,N-di(chloroethyl)aminophenyl]-2,6-bis(trichloromethyl)-s-triazine, 4-[m-bromo-p-N,N-di(chloroethyl)aminophenyl]-2,6-bis(trichloromethyl)-s-triazine, 4-[m-chloro-p-N,N-di(chloroethyl)aminophenyl]2,6-bis(tricholormethyl)-s-triazine, 4-[m-chloro-p-N,N-di(chloroethyl)aminophenyl]-2,6-bis(trichloromethyl)-s-triazine, 4-[m-fluoro-p-N-carbonylethoxycarbonylmethylaminophenyl]-2,6-bis(trichloromethyl)-s-triazine, 4-(m-bromo-p-N-carbonylethoxycarbonylmethylaminophenyl)-2,6-bis(trichloromethyl)-s-triazine, 4-(m-cloro-p-N-carbonylethoxycarbonylmethylaminophenyl)-2,6-bis(trichloromethyl)-s-triazine, 4-(m-flouro-N-carbonyethoxycarbonymethyaminophenyl)-2,6-bis(trichloromethyl)-s-triazine, 4-(o-bromo-p-N-carbonylethoxycarbonylmethylaminophenyl)-2,6-bis(trichloromethyl)-s-triazine, 4-(m-cloro-p-N-carbonylethoxycarbonylmethylaminophenyl)-2,6-bis(trichloromethyl)-s-triazine, 4-(o-fluoro-p-N-carbonylethoxycarbonylmethylaminophenyl)-2,6-bis(trichloromethyl)-s-triazine, 4-(m-bromo-p-N-chloroethylaminophenyl)-2,6-bis(trichloromethyl)-s-triazine, 4-(m-chloro-p-N-chloroethylaminophenyl)-2,6-bis(trichloromethyl)-s-triazine, 4-(m-fluoro-p-N-chloroethylaminophenyl)-2,6-bis(trichloromethyl)-s-triazine, 4-(o-bromo-p-N-chloroethylaminophenyl)-2,6-bis(trichloromethyl)-s-triazine, 4-(o-chloro-p-N-chloroethylaminophenyl)-2,6-bis(trichloromethyl)-s-triazine, 4-(o-fluoro-p-N-chloroethylaminophenyl)-2,6-bis(trichloromethyl)-s-triazine and 2,4-bis(trichloromethyl)-6-[3-bromo-4-[N,N-di(carbonylethoxycarbonylmethyl)amido]phenyl]-1,3,5-triazine.

The aforementioned triazine photoinitiator can be used separately or with a mixture of a plurality of the triazine photoinitiators. The triazine photoinitiator is preferably: 4-[m-bromo-P—N,N-di(ethoxylcarbonylmethoxycarbonylmethyl)aminophenyl]-2,6-di(chlorotrichloromethyl)-s-triazine and 2,4-bis(chlorotrichloromethyl)-6-P-methoxylmethoxy styrene-s-triazine.

The specific examples of the acetophenone compounds are as below: p-dimethylamine acetophenone, α,α'-dimethoxyl azoxy acetophenone, 2,2'-dimethyl-2-phenyl acetophenone, p-methoxyl acetophenone, 2-methyl-1-[4-(methylthio) phenyl]-2-morpholino-1-propanone and 2-benzyl-2-N,N-dimethylamine-1-(4-morpholinophenyl)-1-butanone. The phenethyl ketone compound can be used separately or with a mixture of a plurality of the phenethyl ketone compounds. The phenethyl ketone compound is preferably 2-methyl-1-[4-(methylthio) phenyl]-2-morpholino-1-propanone and 2-benzyl-2-N,N-dimethylamine-1-(4-morpholinophenyl)-1-butanone.

The examples of the biimidazole compounds are as below: 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxylphenyl)-4,4',5,5'-tetraphenylbiimidazole, 2,2'-bis(o-ethylphenyl)-4,4',5,5'-tetraphenylbiimidazole, 2,2'-bis(p-methoxylphenyl)-4,4',5,5'-tetraphenylbiimidazole, 2,2'-bis(2,2',4,4'-tetramethoxylphenyl)-4,4',5,5'-tetraphenylbiimidazole and 2,2'-bis(2-chlorophenyl)-4,4',5,5'-tetraphenylbiimidazole, 2,2'-bis(2,4-dichlorophenyl)-4,4',5,5'-tetraphenylbiimidazole. The biimidazole compound can be used separately or with a mixture of the biimidazole compounds according to requirements, and the biimidazole compound is preferably 2,2'-bis(2,4-dichlorophenyl)-4,4',5,5'-tetraphenylbiimidazole.

The specific examples of the benzophenone compounds are as below: thioxanthone, 2,4-diethylthioxanthone, thioxanthone-4-sulphone, benzophenone, 4,4'-bis(dimethylamine)benzophenone and 4,4'-bis(diethylamino)benzophenone. The benzophenone compound can be used separately or with a mixture of the benzophenone compounds according to requirements, and the benzophenone compound is preferably 4,4'-bis(diethylamino)benzophenone.

The specific examples of the α-diketone compounds are as below: benzil, acetyl group; the specific example of the ketol compound is benzoin; the specific examples of the ketol ether compounds are as below: benzoin methyl ether, benzoin ethyl ether and benzoin isopropyl ether; the specific examples of the acyl phosphine oxide compounds are as below: 2,4,6-trimethylbenzoyl diphenylphosphine oxide and bis-(2,6-dimethoxylbenzoyl)-2,4,4-trimethylphenyl phosphine oxide; the specific examples of the quinone compounds are as below: anthraquinone and 1,4-naphthaquinone; the specific examples of the compounds containing halogens are as below: phenacyl chloride, tribromomethyl phenyl sulfone and tri(trichloromethyl)-s-triazine; and the specific example of the peroxide is bis-tert-butyl peroxide. The aforementioned compound can be used separately or with a mixture of a plurality of the compounds according to the requirements.

The amount of the photoinitiator (C) of the present invention can be adjusted according to requirements, and in an example of the present invention, based on the amount of the compound (B) containing vinyl unsaturated group(s) as 100 parts by weight, the amount of the photoinitiator (C) is 10 parts by weight to 80 parts by weight, preferably 12 parts by weight to 75 parts by weight, and more preferably 15 parts by weight to 70 parts by weight.

Ortho-Naphthoquinone Diazide Sulfonic Acid Ester (D);

The ortho-naphthoquinone diazide sulfonic acid ester (D) of the present invention is subjected to no specific limitation, and a generally used ortho-naphthoquinone diazide sulfonic acid ester (D) can be used. The ortho-naphthoquinone diazide sulfonic acid ester (D) may be a carboxylate that is completely or partially esterified. Preferably, the ortho-naphthoquinone diazide sulfonic acid ester (D) is prepared through the reaction between ortho-naphthoquinone diazide sulfonic acid or the salt thereof and a hydroxyl compound. Preferably, the ortho-naphthoquinone diazide sulfonic acid ester (D) is prepared through the reaction between the ortho-naphthoquinone diazide sulfonic acid or the salt thereof and a multihydroxyl compound.

The aforementioned ortho-naphthoquinone diazide sulfonic acid may include but be not limited to ortho-naphthoquinone diazide-4-sulfonic acid, ortho-naphthoquinone diazide-5-sulfonic acid and ortho-naphthoquinone diazide-6-sulfonic acid. The salt of the aforementioned ortho-naphthoquinone diazide sulfonic acid may include but be not limited to ortho-naphthoquinone diazide halosulphonate.

The aforementioned hydroxyl compound can be used separately or with a mixture of a plurality of the hydroxyl compounds, and the hydroxyl compound may include but be not limited to:

(1) Hydroxybenzophenone compound:

The specific examples of the hydroxybenzophenone compound may include but be not limited to 2,3,4-trihydroxybenzophenone, 2,4,4'-trihydroxybenzophenone, 2,4,6-trihydroxybenzophenone, 2,3,4,4'-tetrahydroxy benzophenone, 2,4,2',4'-tetrahydroxy benzophenone, 2,4,6,3',4'-pentahydroxy benzophenone, 2,3,4,2',4'-pentahydroxy benzophenone, 2,3,4,2',5'-pentahydroxy benzophenone, 2,4,5,3',5'-pentahydroxy benzophenone and 2,3,4,3',4',5'-hexahydroxy benzophenone.

(2) The hydroxyaryl compound may include but be not limited to the hydroxyaryl compound of the formula (I) below:

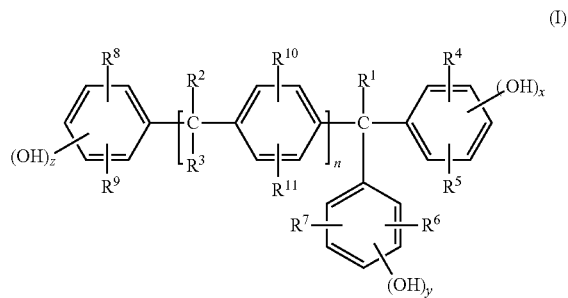

(I)

In the formula (I), $R^1$-$R^3$ represent hydrogen atoms or alkyl groups of $C_1$-$C_6$; $R^4$-$R^9$ represent hydrogen atoms, halogen atoms, alkyl groups of $C_1$-$C_6$, alkoxy groups of $C_1$-$C_8$, alkenyl groups of $C_1$-$C_8$ or cycloalkyl groups; $R^{10}$-$R^{11}$ represent hydrogen atoms, halogen atoms and alkyl groups of $C_1$-$C_6$; x, y and z represent integers 1 to 3; and n represents 0 or 1.

The specific examples of the hydroxyaryl compound of the formula (I) above may include but be not limited to tris(4-hydroxy phenyl)methane, bis(4-hydroxy-3,5-dimethylphenyl)-4-hydroxy phenyl methane, bis(4-hydroxy-3,5-dimethylphenyl)-3-hydroxy phenyl methane, bis(4-hydroxy-3,5-dimethylphenyl)-2-hydroxy phenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxy phenyl methane, bis(4-hydroxy-2,5-dimethylphenyl)-3,4-dihydroxphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(4-hydroxyphenyl)-3-methoxyl-4-hydroxyphenyl methane, bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxy phenyl methane, bis(3-cyclohexyl-4-hydroxy-6-methylphenyl)-2-hydroxy phenyl methane, bis(3-cyclohexyl-4-hydroxy-6-methylphenyl)-3-hydroxy phenyl methane, bis(3-cyclohexyl-4-hydroxy-6-methylphenyl)-4-hydroxy phenyl methane, bis(3-cyclohexyl-4-hydroxy-6-methylphenyl)-3,4-dihydroxyphenyl methane, bis(3-cyclohexyl-6-hydroxy phenyl)-3-hydroxy phenyl methane, bis(3-cyclohexyl-6-hydroxy phenyl)-4-hydroxy phenyl methane, bis(3-cyclohexyl-6-hydroxyphenyl)-2-hydroxy phenyl methane, bis(3- cyclohexyl-6-hydroxy-4-methylphenyl)-2-hydroxy phenyl methane, bis(3-cyclohexyl-6-hydroxy-4-methylphenyl)-4-hydroxy phenyl methane, bis(3-cyclohexyl-6-hydroxy-4-methylphenyl)-3,4-dihydroxy phenyl methane, 1-[1-(4-hydroxy phenyl)isopropyl]-4-[1,1-bis(4-hydroxy phenyl)ethyl] benzene and 1-[1-(3-methyl-4-hydroxy phenyl)isopropyl]-4-[1,1-bis(3-methyl-4-hydroxy phenyl)ethyl]benzene.

(3) (Hydroxy phenyl)hydrocarbon compound, the (hydroxy phenyl)hydrocarbon compound may include but be not limited to the (hydroxy phenyl)hydrocarbon compound of the formula (II) below:

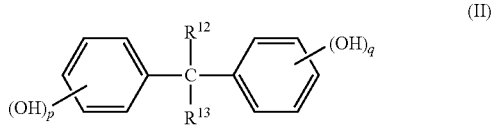

In the formula (II), $R^{12}$ to $R^{13}$ represent hydrogen atoms or alkyl groups of $C_1$-$C_8$, and p and q represent integers 1 to 3.

The specific examples of the (hydroxy phenyl)hydrocarbon compound of the formula (II) above may include but be not limited 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane and bis(2,4-dihydroxyphenyl)methane.

(4) Other aromatic hydroxyl compounds:

The specific examples of the other aromatic hydroxyl compounds may include but be not limited to phenol, metoxyphenol, xylenol, benzenediol, bisphenol A, naphthol, 0 benzenediol, 1,2,3-benzenetriol methyl ether, 1,2,3-benzenetriol-1,3-dimethyl ether, 3,4,5-trihydroxybenzoic acid and completely or partially esterified 3,4,5-trihydroxybenzoic acid, 4,4'-[1-[4-[-1-(4-hydroxy phenyl)-1-Methylethyl]phenyl]ethylene] bisphenol.

Preferably, the aforementioned hydroxyl compound is selected from a group consisting of 4,4'-[1-[4-[-1-(4-hydroxy phenyl)-1-Methylethyl]phenyl]ethylene]bisphenol, 2,3,4-benzophenone trihydroxybenzophenone, 2,3,4,4'-tetrahydroxy benzophenone, 2-(2,3,4-trihydroxyphenyl)-2-(2',3',4'-trihydroxyphenyl)propane and any combination thereof.

The aforementioned reaction between the ortho-naphthoquinone diazide sulfonic acid or the salt thereof and the hydroxyl compound are often performed in organic solution mediums such as dioxane, N-pyrrolidone and acetamide, and meanwhile it is helpful to react in the presence of alkaline condensing agents such as trolamine, alkali metal carbonates or alkali metal hydrogen carbonates.

Preferably, the esterification degree of the aforementioned ortho-naphthoquinone diazide sulfonic acid ester (D) is above 50%. That is, when the total amount of hydroxyl groups in the aforementioned hydroxyl compound is calculated as 100 mol %, the esterification reaction is performed between above 50 mol % hydroxyl groups of the hydroxyl compound and the O naphthoquinone diazide sulfonic acid or the salt thereof. More preferably, the esterification degree of the naphthoquinone diazide compound (B) is above 60%.

Based on the total amount of the alkali-soluble resin (A) as 100 parts by weight, the amount of the ortho-naphthoquinone diazide sulfonic acid ester (D) falls in a range 0.2 parts by weight to 15 parts by weight, preferably 0.3 parts by weight to 10 parts by weight, and more preferably 0.4 parts by weight to 6 parts by weight.

It should be illustrated herein that the ortho-naphthoquinone diazide sulfonic acid ester (D) can increase the resolution of the spacer or protective film formed during the subsequent processes of the photosensitive resin composition of the present invention. If the ortho-naphthoquinone diazide sulfonic acid ester (D) is not used, the resulted spacer or protective film formed during the subsequent processes of the photosensitive resin composition will have a poor resolution.

Thermal Initiator (E)

The thermal initiator (E) of the present invention includes but is not limited to azo compounds, peroxides and hydrogen peroxide compounds.

The specific examples of the aforementioned azo compounds may include but be not limited to 2,2'-azobis(isobutyronitrile), 2,2'-azobis(2-methyl butyronitrile), 1,1'-azobis(cyclohexane-1-carbonitrile), 2,2'-azobis(2,4-dimethylvaleronitrile, 1-[(1-cyano-1-methylethyl)azo] formamide, 2,2-azobis{2-methyl-N-[1,1-bis(hydroxymethyl)-2-hydroxyethyl]propionamide, 2,2'-azobis[N-(2-propenyl)-2-methylpropionamide, 2,2'-azobis[N-(2-propenyl)-2-ethyl propionamide, 2,2'-azobis(N-butyl-2-methylpropionamide), 2,2'-azobis(N-cyclohexyl-2-methyl propionamide), 2,2'-azobis(dimethyl-2-methyl propionamide), 2,2'-azobis(dimethyl-2-methylpropionate) or 2,2'-azobis(2,4,4-trimethyl pentene).

The specific examples of the aforementioned peroxides may include but be not limited to mixtures of benzoyl peroxide, peroxy bis(tert-butyl), diisobutyryl peroxide, cumyl peroxyneodecanoate, di-n-propyl peroxydicarbonate, diisopropyl peroxydicarbonate, di-sec-butyl peroxydicarbonate, 1,1,3,3-tetramethylbutyl peroxyneodecanoate, di(4-t-butyl cyclohexyl) peroxydicarbonate, 1-cyclohexyl-1-methylethyl peroxyneodecanoate, di(2-ethoxy-ethyl) peroxydicarbonate, di(2-ethylhexyl) peroxydicarbonate, t-hexyl peroxyneodecanoate, dimethoxybutyl peroxydicarbonate, t-butyl peroxyneodecanoate, t-hexyl peroxypivalate, t-butyl peroxypivalate, di(3,5,5-trimethyl hexanoyl) peroxide, di-n-octanoyl peroxide, dilauroyl peroxide, distearoyl peroxide, 1,1,3,3-tetramethylbutylperoxy-2-ethylhexanoate, 2,5-dimethyl-2,5-di(2-ethylhexanoylperoxy)hexane, t-hexylperoxy-2-ethylhexanoate, di(4-methylbenzoyl) peroxide, t-butylperoxy-2-ethylhexanoate, dibenzoyl peroxide, t-butyl peroxyisobutyrate, 1,1-di(t-butylperoxy)-2-methylcyclohexane, 1,1-di(t-hexyl peroxy)-3,3,5-trimethylcyclohexane, 1,1-di(t-hexyl peroxy)cyclohexane, 1,1-di(t-butylperoxy)cyclohexane, 2,2-di[4,4-di(t-butylperoxy)cyclohexyl]propane, t-hexyl peroxy isopropyl monocarbonate, t-butylperoxy maleate, t-butyl peroxy-3,5,5-trimethyl hexanoate, t-butyl peroxy laurate, 2,5-dimethyl-2,5-di-(3-methyl benzoyl peroxy)hexane, t-butyl peroxy isopropyl monocarbonate, t-butyl peroxy-2-ethylhexyl monocarbonate, t-hexyl peroxy benzoate, 2,5-dimethyl-2,5-di(benzoyl peroxy)hexane, t-butyl peroxy acetate, 2,2-di(t-butylperoxy) butane, t-butyl peroxy benzoate, n-butyl-4,4-di(t-butylperoxy) valerate, di(2-t-butyl peroxy isopropyl)benzene, dicumyl peroxide, di-t-hexyl peroxide, 2,5-dimethyl-2,5-di(t-butyl peroxy) hexane, di-t-butyl peroxide, 2,5-dimethyl-2,5-di(t-butylperoxy) hexyne-3, t-butyl trimethylsilyl peroxide, di(3-methylbenzoyl) peroxide-benzoyl (3-methylbenzoyl) peroxide and dibenzoyl peroxide.

The specific examples of the aforementioned hydrogen peroxide compounds may include but be not limited to p-menthane hydroperoxide, diisopropylbenzene hydroperoxide, 1,1,3,3-tetramethyl butyl hydroperoxide, cumene hydroperoxide and t-butyl hydroperoxide.

Preferably, the specific examples of the thermal initiator (E) may include but be not limited to 2,2'-azobis(isobutyronitrile), 2,2'-azobis(2-methyl butyronitrile), 2,2'-azobis(2,4- dimethylvaleronitrile, peroxide diisobutyryloxy, dibenzoyl peroxide, t-butylperoxy isobutyrate, isopropylbenzene hydroperoxide, cumyl peroxyneodecanoate, p-menthane hydroperoxide or diisopropylbenzene hydroperoxide.

The thermal initiator (E) can be used separately or with a mixture of a plurality of thermal initiators (E). Based on the total amount of the alkali-soluble resin (A) as 100 parts by weight, the amount of the thermal initiator (E) is 0.2 parts by weight to 10 parts by weight, preferably 0.3 parts by weight to 9 parts by weight, and more preferably 0.4 parts by weight to 8 parts by weight.

It should be supplemented that the thermal initiator (E) can increase the adherence of the photosensitive resin composition of the present invention during the pre-baking process. If the thermal initiator (E) is not used, the resulted photosensitive resin composition will have poor adherence after being developed.

Solvent (F)

The solvent (F) of the present invention can be dissolved completely with other organic compositions, and the volatility of the solvent (F) should be that the solvent (F) can be evaporated from the dispersion liquid with little heat under normal pressure. Therefore, a solvent with a boiling point below 150° C. under normal pressure is used mostly. The appropriate solvent (F) includes aromatics, such as benzene, methylbenzene and dimethylbenzene; alcohols, such as methanol and ethanol; ethers, such as ethylene glycol monopropyl ether, diethylene glycol dimethyl ether, tetrahydrofuran, ethylene glycol monomethyl ether, ethylene glycol monoethyl ether, diethylene glycol methyl ether, diethylene glycol ethyl ether, diethylene glycol butyl ether, esters, such as glycol monomethyl ether acetate, glycol ether acetate, propylene glycol monomethyl ether acetate, propylene glycol ethyl ether acetate, propylene glycol propyl ether acetate, ethyl 3-ethoxylpropionate; and ketones such as ethylmethyl ketone and acetone. It is preferably to use the diethylene glycol dimethyl ether, the propylene glycol monomethyl ether acetate and the ethyl 3-ethoxylpropionate cooperatively, which leads to an excellent storage stability of the photosensitive resin composition. Based on the total amount of the alkali-soluble resin (A) as 100 parts by weight, the amount of the solvent (F) is 500 parts by weight to 3000 parts by weight, preferably 500 parts by weight to 2500 parts by weight, and more preferably 500 parts by weight to 2000 parts by weight.

Additives (G)

Additionally, the photosensitive resin composition of the present invention can be further added with additives (G) according you the required physical and chemical characteristics, and the selection of the additives (G) can be made by those of ordinary skills in the art. In an example of the present invention, the additive (G) may be a loading agent, polymers except the alkali-soluble resin (A), ultraviolet light absorber, anti-agglutinate, surfactant, adhesion accelerator, storage stabilizer or heat-resistance promoter.

The specific examples of the aforementioned loading agent are as below: glass and aluminum.

The specific examples of the aforementioned polymers except the alkali-soluble resin (A) are as below: polyvinyl alcohol, polyethylene glycol monoalkyl ether, Polyfluoro alkyl acrylate.

The specific examples of the aforementioned ultraviolet light absorber are as below: 2-(3-t-butyl-5-methyl-2-hydroxy phenyl)-5-chlorophenyl nitrine and alkoxy benzophenone; and the anti-agglutinant is polyacrylate sodium.

The aforementioned surfactant can facilitate the coating ability of the photosensitive resin composition of the present invention, and the surfactant may include but be not limited to a fluorine-containing surfactant or a silicone surfactant.

The aforementioned fluorine-containing surfactant at least includes fluorinated alkyl or fluorinated thiazolinyl at the end, main chain and branch chain thereof, and the specific examples thereof are as below: 1,1,2,2-tetrafluoropropyl) ether, 1,1,2,2-tetrafluoro octylhexyl ether, octaethylene glycol di(1,1,2,2-tetrafluorobutyl)ether, hoxaethylene glycol (1,1,2,2,3,3-hexafluoropentyl)ether, octapropanediol di(1,1,2,2-tetrafluorobutyl)ether, hoxapropanediol (1,1,2,2,3,3-hexafluoropentyl)ether, perfluoro sodium dodecyl sulfate, 1,1,2,2,8,8,9,9,10,10-Perfluorododecane, 1,1,2,2,3,3-hexafluorodecane, fluothane benzene sulfonate, fluothane sodium phosphate, fluothane carboxylic sodium, fluothane polyethenoxy ether, dipropanetriol tetra(fluothane polyethenoxy ether), fluothane ammonium iodide, fluothane lycine, Perfluoroalkyl polyethenoxy ether and perfluoroalkyl alkanol. In another example of the present invention, the fluorine-containing surfactant is BM-1000, BM-1100 (manufactured by BM CHEMIE), Megafac F142D, F172, F173, F183, F178, F191, F471, F476 (manufactured by Dainippon Ink And Chemicals, Inc.), Fluorad FC 170C, FC-171, FC-430, FC-431 (manufactured by Sumitomo Chemical Co., Ltd), chlorofluorocarbons S-112, S-113, S-131, S-141, S-145, S-382, SC-101, SC-102, SC-103, SC-104, SC-105, SC-106 (manufactured by AGC Display Glass Co., Ltd.), F Top EF301, 303, 352 (manufactured by Shin-Akita Kasei), Ftergent FT-100, FT-110, FT-140A, FT-150, FT-250, FT-251, FTX-251, FTX-218, FT-300, FT-310, FT-400S (manufactured by NEOSU).

The specific examples of the aforementioned silicone surfactant are as below: Toray silicone, with the trade name of DC 3 Paint Additive (DC 3 PA), DC 7 PA, SH 11 PA, SH 21 PA, SH 28 PA, SH 29 PA, SH 30 PA, SH 190, SH 193, SZ 6032, SF-8427, SF-8428, DC 57, DC 190 (manufactured by Dow Corning Toray Silicone), TSF-4440, TSF-4300, TSF-4445, TSF-4446, TSF-4460, TSF-4452 (manufactured by Momentive Performance Materials Inc.).

The aforementioned surfactant may also be other surfactants in addition to the aforementioned fluorine-containing surfactant and a silicone surfactant, and the other surfactants may include but be not limited to polyoxyethylene alkyl ether, such as lauryl alcohol polyoxyethylene ether, polyoxyethylene stearate ether and polyoxyethylene oleyl ether; polyoxyethylene aryl ether, such as polyoxyethylene n-octyl phenyl ether and polyoxyethylene n-nonyl ether; polyoxyethylene dialkyl, such as polyoxyethylene dilaurate and polyoxyethylene distearate; and nonionic surfactant, such as KP341 (manufactured by Shin-Etsu Chemical Co., Ltd.) and poly flow No. 57, 95 (manufactured by Kyoeisha grease Chemical Industries, Ltd.). The aforementioned surfactant can be used separately or with a mixture of a plurality of the surfactants.

The aforementioned adhesion accelerator can improve the adherence of the substrate, and the adhesion accelerator is preferably a functional silane crosslinking agent. Preferably, the functional silane crosslinking agent includes carboxyl group, thiazolinyl group, isocyanate group, epoxy group, amido group, hydrosulphonyl group or halogens.

The specific examples of the aforementioned adhesion accelerator areas below: p-hydroxy phenyl trimethoxyl silane, 3-methacryloxypropyl trimethoxysilane, vinyl triacetoxysilane, vinyl trimethoxysilane, vinyl triethoxylsilane, vinyl tri(2-methoxyethoxyl)silane, γ-isocyanatepropyl triethoxylsilane, 3-ethoxylpropoxylpropyl trimethoxysilane, 2-(3,4-ethoxylcyclohexyl)ethyl trimethoxysilane, 3-ethoxylpropoxyl dimethyl methoxylsilane, 3-aminopropyl trimethoxysilane, N-(2-amidoethyl)-3-amidopropyl trimethoxysilane, N-(2-amidoethyl)-3-amidopropylmethyl dimethoxysilane, 3-mercaptpropyl trimethoxysilane, 3-chloropropyl trimethoxysilane and 3-chloropropylmethyl dimethoxysilane. The aforementioned adhesion accelerator can be used separately or with a mixture of a plurality of the adhesion accelerators according to the requirements.

The aforementioned storage stabilizer may include but be not limited to sulfur, quinones, hydroquinones, polyoxides, amines, nitroso compounds or nitryl group, and the specific examples thereof are as below: 4-methoxyl phenol, (N-nitroso-N-phenyl)hydroxylamine aluminum, 2,2'-thio-bis(4-methyl-6-t-butylphenol) and 2,6-di-t-butylphenol.

The aforementioned heat-resistance promoter may include be but not limited to N-(alkoxymethyl)glycoluril compound and N-(alkoxymethyl) melamine.

The specific examples of the aforementioned N-(alkoxymethyl)glycoluril compound are as below: N,N,N',N'-tetra(methoxylmethyl)glycoluril, N,N,N',N'-tetra(ethoxylmethyl)glycoluril, N,N,N',N'-tetra(n-propoxylmethyl)glycoluril, N,N,N',N'-tetra(isopropoxylmethyl)glycoluril, N,N,N',N'-tetra(n-butoxymethyl)glycoluril and N,N,N',N'-tetra(t-butoxymethyl)glycoluril, and preferably the N,N,N',N'-tetra(methoxylmethyl)glycoluril. The specific examples of the aforementioned N-(alkoxymethyl)melamine are as below: N,N,N',N',N'',N''-hexa(methoxylmethyl)melamine, N,N,N',N',N'',N''-hexa(ethoxylmethyl)melamine, N,N,N',N',N'',N''-hexa(n-propoxylmethyl)melamine, N,N,N',N',N'',N''-hexa(isopropoxylmethyl)melamine, N,N,N',N',N'',N''-hexa(n-butoxymethyl)melamine and N,N,N',N',N'',N''-hexa(t-butoxymethyl)melamine, and preferably the N,N,N',N',N'',N''-hexa(methoxylmethyl)melamine. The commercial products of the aforementioned N-(alkoxymethyl)melamine are exemplified as NIKARAKKU N-2702, MW-30M (manufactured by Sanwa Chemical).

The amount of the additives (G) of the present invention can be determined by those skilled in the art. Preferably, based on the amount of the alkali-soluble resin (A) as 100 parts by weight, the amount of the additives (G) is 0 parts by weight to 10 parts by weight, preferably 0 parts by weight to 6 parts by weight, and more preferably 0 parts by weight to 3 parts by weight.

Photosensitive Resin Composition

The photosensitive resin composition of the present invention is generally manufactured by mixing the aforementioned alkali-soluble resin (A), compound (B) containing vinyl unsaturated group(s), photoinitiator (C), ortho-naphthoquinone diazide sulfonic acid ester (D), thermal initiator (E) and solvent (F) in a mixer uniformly to get a solution. If necessary, the photosensitive resin composition can be added with additives (G) such as a loading agent, polymers except the alkali-soluble resin (A), ultraviolet light absorber, anti-agglutinant, surfactant, adhesion accelerator, storage stabilizer or heat-resistance promoter.

Preparation Method of Spacer or Protective Film

The present invention provides a method for forming a thin film on the substrate, in which the photosensitive resin composition of the present invention is applied onto the substrate; and preferably, the thin film is a spacer or protective film.

In an example of the present invention, the preparation method of the spacer or protective film at least includes the following steps:

(a) applying the photosensitive resin composition of the present invention onto the substrate to form a thin film;
(b) exposing at least one part of the thin film with radiation light;
(c) developing after the exposure; and
(d) heating after the development.

Those steps are sequentially illustrated as follows:

In the step (a), the photosensitive resin composition of the present invention is applied onto the substrate to form a thin film. During forming of the thin film, a pixel layer consisting of red, green and blue coloring layers is first formed on a transparent substrate, and then the photosensitive resin composition of the present invention is formed on the pixel layer. During the formation of the spacer, a transparent conductive film is formed on the transparent substrate where the protective film and pixel layer are already formed, and then a thin film of the photosensitive resin composition of the present invention is formed on the transparent conductive film.

In an example of the present invention, the transparent substrate is a glass substrate or a resin substrate, and preferably is the glass substrate, such as soda-lime glass and alkali-free glass. The specific examples of the resin substrate are polyethylene terephthalate, polybutylene terephthalate, polyethersulfone, polycarbonate and polyimide.

An example of the transparent conductive film formed on the whole surface of the transparent substrate is a NESA film (USA PPG) that includes $SnO_2$ or an ITO film that includes $In_2O_3$—$SnO_2$.

The film forming method includes coating or dry film method.

In the coating method, the photosensitive resin composition of the present invention is coated on the aforementioned transparent conductive film or the transparent substrate, and the being-coated surface of which is preferably heated (prebaking). The concentration of the solid contents in the composition solution applied in the coating method is 5 parts by weight to 50 parts by weight, preferably 10 parts by weight to 40 parts by weight, and more preferably 15 parts by weight to 35 parts by weight. The coating method may include but be not limited to spray coating, roll coating, spin coating, slit die coating, stick coating and inkjet coating, in which the spin coating or the slit die coating is preferred.

Additionally, in the dry film method, a photosensitive dry film containing the photosensitive resin composition of the present invention (photosensitive dry film for short) is stacked on a base film.

On a dry film, the aforementioned photosensitive dry film can be stacked and form a photosensitive film after the solvent is removed. The concentration of the solid contents in the composition solution applied for the dry film method is 5 parts by weight to 50 parts by weight, preferably 10 parts by weight to 50 parts by weight, more preferably 20 parts by weight to 50 parts by weight, and more preferably 30 parts by weight to 50 parts by weight. The specific examples of the photosensitive dry film are polyethylene terephthalate (PET), polyethylene, polypropylene, polycarbonate and polyvinyl chloride. The thickness of the base film of the photosensitive dry film is preferably 15 μm to 125 μm, and more preferably 1 μm to 30 μm.

The photosensitive dry film can also be stacked and covered with a covering film for storage when being not used. The covering film of the present invention is preferably releasable, so that it can be easily separated for use and not be separated when not being used. The specific example of the covering film having the aforementioned characteristic is a synthetic resin film such as a PET thin film, a polypropylene thin film, a polyethylene thin film, a polyvinyl chloride thin film and a polyurethane thin film, which is coated or printed with a silicone release agent thereon. The thickness of the covering film is about 5 to 30 μm. The covering film can also be stacked of two or three layers.

In a specific example of the dry film stacking method, a transparent base film can be hot-press laminated with a transparent photosensitive dry film.

Among the aforementioned methods, the film is preferably prepared by the coating method prior to the dry film method, and more preferably performs a pre-baking step before the coating method. The pre-baking conditions can be different according to the composition and the mixing proportion, and preferably the film is heated at 70-120° C. for 1-15 minutes. Among the aforementioned methods, the film is preferably prepared by the coating method prior to the dry film method.

The thickness of the film after pre-baking is preferably 0.5 to 10 μm, and more preferably 1.0 to 7.0 μm.

In step (b) at least one part of the thin film is irradiated with radiation light. When a part of the film is irradiated, a light mask with a predetermined pattern, for example, can be used.

The specific example of the radiation light is the visible light, the ultraviolet light or the far-infrared light. The wavelength of the radiation light is preferably 250 to 550 nm, which includes the range of the ultraviolet light, and more preferably 365 nm is included.

Radiation amount (exposure amount) is the radiation light intensity measured through a luminometer (OAI model 356, Optical Associates Inc.) at a wavelength of 365 nm. The radiation light intensity is preferably 100 to 5,000 J/m$^2$, and more preferably 200 to 3,000 J/m$^2$.

In step (c), the development is performed after the irradiation, so as to remove unnecessary parts and form a predetermined pattern.

A specific example of the developing solution is inorganic base, such as sodium hydroxide, potassium hydroxide, sodium carbonate, sodium silicate, metasilicate sodium and ammonia; the primary fatty amine, such as ethylamine and n-propylamine; the secondary fatty amine, such as diethylamine and n-propylamine; the tertiary fatty amine, such as trimethylamine, diethylamine methyl, dimethylethylamine and triethylamine; the tertiary fatty cyclo-acid, such as pyrrole, piperidine, N-methyl piperidine, N-methyl 1,8-diazabicyclo[5.4.0]-7-undecylene and 1,5-diazabicyclo[4.3.0]-5-nonene; the third-grade aromatic amine, such as pyridine, methylpyrimidine, dimethyl pyridine and quinoline; and the quaternary ammonium salt alkaline compound, such as the aqueous solution of tetramethyl ammonium hydroxide and tetraethyl ammonium hydroxide. The water-soluble organic solvent and/or surfactant, such as methanol and ethanol, can also be added into the aforementioned alkaline compound according to requirements.

The development method is exemplified as an immersion method, including a soaking method, an immersion method or a showering method, and preferably the development method is performed for about 10 seconds under room temperature to 180° C.

The desired pattern is washed with vapor for 30 to 90 seconds after the development, and then is dried through the compressed air or nitrogen.

In step (d) heating is performed after the development. The resulted film with pattern is heated for 30 to 180 minutes in an appropriate heater such as a heating plate or a baking oven (post baking).

The aforementioned resulted spacer or protective film with the desired pattern has excellent characteristics such as anti-stress strength, abrasive resistance of the liquid crystal alignment film thereof and the adherence to the substrate.

Preparation Method of Liquid Crystal Display Device

The present invention also provides a LCD including the aforementioned thin film.

In the LCD of the present invention the aforementioned photosensitive resin composition is used to form a spacer, and at least one side of the LCD a protective film is formed, and more preferably at both sides.

The LCD of the present invention can be prepared though the following two methods.

(1) On one side or both sides of a first (electrode) transparent substrate with a transparent conductive film on at least one side thereof, the photosensitive resin composition of the present invention is formed as a protective film or spacer through the aforementioned methods. Thereafter, an alignment film has characteristic of liquid crystal alignment is formed on the transparent conductive layer having the spacer and/or protective film. The sides of these substrates where the alignment films are formed are regarded as the inner face, and the liquid crystal directions of various alignment films are antiparallel or perpendicular to each other and the alignment films are reverse configured with certain intercellular spaces. The intercellular space defined by the substrate surface (alignment film) and the gap is filled with liquid crystal, and then the filled holes are encapsulated as liquid crystal units. Therefore the internal and external liquid crystal units can form a LCD with the same alignment direction on both internal and external surfaces by adhering to a vertical polarizer or being arranged at a liquid crystal polarization direction of a substrate surface.

(2) On one side or both sides of a first transparent substrate with a transparent conductive film on at least one side thereof, the photosensitive resin composition of the present invention is formed as a protective film or spacer through the methods aforementioned in (1). Afterwards, a UV curing type adhesion agent is coated on the substrate along the end points, and afterwards tiny liquid crystal is dropped onto the substrate through a liquid crystal dispenser, and then the substrate is stacked under vacuum, and the substrate can be encapsulated under a high-pressure mercury lamp that can emit ultraviolet light. Finally the polarizing plates inside and outside the liquid crystal are adhered to form the liquid crystal display device.

The specific example of the LCD of the present embodiment is applied in a nematic liquid crystal or a smectic liquid crystal, and preferably is the nematic liquid crystal, such as the Shiff basic type liquid crystal, azoxy liquid crystal, diphenyl liquid crystal, phenylcyclohexane liquid crystal, ester liquid crystal, terphenyl liquid crystal, biphenyl cyclohexane liquid crystal, pyrimidine liquid crystal, dioxanepoly cyclooctane liquid crystal, bicyclicoctane liquid crystal, cuneone liquid crystal, chloride liquid crystal, cholesteric liquid crystal such as the cholesterol carbonate or cholesteric liquid crystal; and ferroelectric liquid crystal including chiral materials such as p-decyloxy benzylidene-p-amido-2-methylbutyl cinnamate (C-15, CB-15, manufactured by Merck) may also be added.

At the external side of the liquid crystal a polarizing plate, alignment extending of the polyvinyl alcohol, a [H film] which can absorb iodine or a H film clamped between a fiber acetate protective film and the polarizing plate is used.

Various embodiments are used hereinafter to illustrate the application of the present invention, but it is not intended to limit the present invention. For those skilled in the art of the present invention, various variations and modifications can be made without departing from the spirit and scope of the present invention.

DETAILED DESCRIPTION

The following are Synthesis Examples 1 to 3 for synthesizing the alkali-soluble resins (A-1) to (A-3) according to Table 1.

Synthesis Example 1

Method of Synthesizing Alkali-Soluble Resin (A-1)

A 1000 mL four-necked conical flask equipped with a nitrogen inlet, a stirrer, a heater, a condenser and a thermometer was purged with nitrogen gas, and the components listed in Table 1 were charged to the flask. The aforementioned components comprising 30 parts by weight of methacrylic acid (hereinafter abbreviated as MAA), 25 parts by weight of t-butyl methacylate (hereinafter abbreviated as TBMA), 20 parts by weight of styrene monomer (hereinafter abbreviated as SM), 2.4 parts by weight of 2,2'-azobis(2-methyl butyronitrile) (hereinafter abbreviated as AMBN) and 240 parts by weight of diethylene glycol dimethyl ether (hereinafter abbreviated as Diglyme) were stirred slowly, heated to 85° C. and left to polycondense for 5 hours at the same temperature. Subsequently, after the solvent was volatilized, the alkali-soluble resin (A-1) was obtained.

Synthesis Example 2

Method of Synthesizing Alkali-Soluble Resin (A-2)

A 1000 mL four-necked conical flask equipped with a nitrogen inlet, a stirrer, a heater, a condenser and a thermometer was purged with nitrogen gas, and the components listed in Table 1 were charged to the flask. The aforementioned components comprising 35 parts by weight of 2-methacryloyloxyethyl succinate monoester (hereinafter abbreviated as HOMS), 20 parts by weight of 3,4-epoxycyclohexylmethyl methacrylate (hereinafter abbreviated as EC-MAA), 5 parts by weight of 2-hydroxyethyl methacrylate (hereinafter abbreviated as HEMA), 20 parts by weight of dicyclopentanyl methacrylate (hereinafter abbreviated as FA-513M), 20 parts by weight of SM, 2.4 parts by weight of 2,2'-azobis(2,4-dimethylvaleronitrile) (hereinafter abbreviated as ADVN) and 240 parts by weight of propylene glycol monomethyl ether acetate (hereinafter abbreviated as PGMEA) were stirred slowly, heated to 80° C. and left to polycondense for 6 hours at the same temperature. Subsequently, after the solvent was volatilized, the alkali-soluble resin (A-2) was obtained.

Synthesis Example 3

Method of Synthesizing Alkali-Soluble Resin (A-3)

A 1000 mL four-necked conical flask equipped with a nitrogen inlet, a stirrer, a heater, a condenser and a thermometer was purged with nitrogen gas, and the components listed in Table 1 were charged to the flask. The aforementioned components comprising 30 parts by weight of MAA, 20 parts by weight of GMA, 5 parts by weight of EC-MAA, 10 parts by weight of HEMA, 10 parts by weight of FA-513M, 25 parts by weight of benzyl methacrylate (hereinafter abbreviated as BzMA), 3.0 parts by weight of AMBN, 200 parts by weight of Diglyme and 40 parts by weight of PGMEA were stirred slowly, heated to 85° C. and left to polycondense for 5 hours at the same temperature. Subsequently, after the solvent was volatilized, the alkali-soluble resin (A-3) was obtained.

Method of Preparing Photosensitive Resin Composition

The following are Examples 1 to 7 and Comparative Examples 1 to 3 for preparing the photosensitive resin compositions according to Table 2.

Example 1

100 parts by weight of alkali-soluble resin (A-1), 20 parts by weight of dipentaerythritol hexaacrylate (B-1), 10 parts by weight of 1-[4-(phenylthio)phenyl]-octane-1,2-diketone 2-(O-benzoyloxime) (C-1), 0.2 parts by weight of ortho-naphthoquinone diazide sulfonic acid ester (D-1) formed from the 4,4'-[1-[4-[−1-(4-hydroxy phenyl)-1-methylethyl]phenyl]ethylene]bisphenol and ortho-naphthoquinone diazide-5-sulfonic acid, and 1 parts by weight of cumyl peroxyneodecanoate (E-2) were mixed and dissolved in 500 parts by weight of propylene glycol monomethyl ether acetate (F-1) completely, so as to form the photosensitive resin composition of Example 1. Afterwards, the sensibility of the spacer formed by the photosensitive resin composition and the shape of the post-baked pattern were measured by using the detection methods of the resolution and the development adherence that were described as follows.

Examples 2 to 7

Examples 2 to 7 were practiced with the same method as in Example 1 by using various kinds or amounts of the components of the photosensitive resin composition, the formulas and evaluation results of which were listed in Table 2.

Comparative Examples 1 to 3

Comparative Examples 1 to 3 were practiced with the same method as in Example 1 by using various kinds or amounts of the components of the photosensitive resin composition, the formulas and evaluation results of which were also listed in Table 2.

Method of Preparing Spacer or Protective Film

Various photosensitive resin compositions of Examples 1 to 7 and comparative examples 1 to 3 were spin coated independently on a prime glass substrate of 100×100×0.7 mm in size, and then pre-baked for 2-3 minutes at 90° C. to obtain a pre-baked coating film of about 6 µm in thickness. And then, the pre-baked coating film was placed under the light mask with a given pattern, and ultraviolet light (exposure machine AG500-4N; manufactured by M&R Nano Technology) of 100 mJ/cm$^2$ was used to irradiate the film. Afterwards, the exposed coating film was immersed in 0.05% KOH solution for 45 seconds to remove the unexposed parts, and then the film was washed by pure water; followed by being post-baked for 30 minutes at 235° C., so as to form a spacer or protective film that includes columns with the given pattern formed through the light mask on the prime glass substrate.

Performance Evaluation of the Spacer Film or Protective Film

The resolution and development adherence of the aforementioned resulted spacer film or protective film could be detected in the following steps, so as to evaluate the performance thereof.

1. Resolution:

The spacer film or protective film formed on the prime glass substrate was observed under a microscope (for example, Eclipse 50i, manufactured by Nikon) and a scanning electron microscope (SEM) (for example S-3000N, manufactured by Hitachi) to detect the minimum possible diameter of the column that can be formed.

○: minimum possible diameter of the column≤15 μm
Δ: 15≤μm minimum possible diameter of the column<20 μm
X: 20 μm<minimum possible diameter of the column 2. Development Adherence:

The pre-baked coating film was placed under the light mask with a given pattern, and ultraviolet light (exposure machine AG500-4N; manufactured by M&R Nano Technology) of 100 mJ/cm² was used to perform the exposure step. Afterwards, the exposed coating film was immersed in 0.05% KOH solution for 45 seconds to remove the unexposed parts, and then 100 columns with a diameter of 15 μm were developed. After being washed with pure water, the number of the developable columns was detected with a microscope (for example, Eclipse 50i, manufactured by Nikon).

○: less than 10 damaged columns
X: equal to or more than 10 damaged columns

According to the results of Table 2, when the ortho-naphthoquinone diazide sulfonic acid ester (D) and the thermal initiator (E) are added into the photosensitive resin composition, the resulted spacer film or protective film will have an excellent resolution and development adherence for achieving the purpose of the present invention.

It should be supplemented that, although specific compounds, components, reactive conditions, processes, analysis methods or specific equipment are described as examples of the present invention, to illustrate the light guide plate, light-emitting unit and the LCD having the light-emitting unit of the present invention. However, as is understood by a person skilled in the art, the present invention is not limited to those. Without departing from the spirit and scope of the present invention, the light guide plate, light-emitting unit and the LCD having the light-emitting unit of the present invention also can be manufactured by using other compounds, components, reactive conditions, processes, analysis methods and equipment.

As is understood by a person skilled in the art, the foregoing preferred embodiments of the present invention are illustrated of the present invention rather than limiting of the present invention. In view of the foregoing, it is intended to cover various modifications and similar arrangements included within the spirit and scope of the appended claims. Therefore, the scope of which should be accorded the broadest interpretation so as to encompass all such modifications and similar structure.

TABLE 1

| Synthesis Examples | Components Polymerizable Monomers (parts by weight) | | | | | | | | |
|---|---|---|---|---|---|---|---|---|---|
| | MAA | HOMS | GMA | EC-MAA | HEMA | TBMA | FA-513M | BzMA | SM |
| A-1 | 30 | | 25 | | | 25 | | | 20 |
| A-2 | | 35 | | 20 | 5 | | 20 | | 20 |
| A-3 | 30 | | 20 | 5 | 10 | | 10 | 25 | |

| Synthesis Examples | Components | | | | Reaction temperature (° C.) | Polycondensation time (h) |
|---|---|---|---|---|---|---|
| | Solvent (parts by weight) | | Catalyst (parts by weight) | | | |
| | Diglyme | PGMEA | AMBN | ADVN | | |
| A-1 | 240 | | 2.4 | | 85 | 5 |
| A-2 | | 240 | | 2.4 | 80 | 6 |
| A-3 | 200 | 40 | 3.0 | | 85 | 5 |

| Compounds | Names |
|---|---|
| AMBN | 2,2'-azobis(2-methyl butyronitrile) |
| ADVN | 2,2'-azobis(2,4-dimethylvaleronitrile) |
| MAA | methacrylic acid |
| HOMS | 2-methacryloyloxyethyl succinate monoester |
| GMA | glycidyl methacylate |
| EC-MAA | 3,4-epoxycyclohexylmethyl methacrylate |
| HEMA | 2-hydroxyethyl methacrylate |
| TBMA | t-butyl methacrylate |
| FA-513M | dicyclopentanyl methacrylate |
| BzMA | benzyl methacrylate |
| SM | styrene monomer |
| Diglyme | diethylene glycol dimethyl ether |
| PGMEA | propylene glycol monoethyl ether acetate |

TABLE 2

| Components | | Examples | | | | | | | Comparative Examples | | |
|---|---|---|---|---|---|---|---|---|---|---|---|
| | | 1 | 2 | 3 | 4 | 5 | 6 | 7 | 1 | 2 | 3 |
| Alkali-soluble resin (A) (parts by weight) | A-1 | 100 | | | 50 | 100 | | | 100 | | |
| | A-2 | | 100 | | 50 | | 100 | | | 100 | |
| | A-3 | | | 100 | | | | 100 | | | 100 |
| Compound (B) containing vinyl unsaturated group(s) (parts by weight) | B-1 | 20 | 30 | | | 100 | 80 | | 100 | 100 | |
| | B-2 | | | 100 | 150 | | | 100 | | | 100 |
| | B-3 | | 20 | | | 100 | | | | | |

TABLE 2-continued

| | | | | | | | | | | | |
|---|---|---|---|---|---|---|---|---|---|---|---|
| Photoinitiator (C) | C-1 | 10 | 15 | | 30 | 30 | | 15 | 30 | 30 | |
| (parts by weight) | C-2 | | | 20 | | | 30 | | | | 20 |
| | C-3 | | 5 | 5 | | 10 | | 10 | | 5 | |
| Ortho-naphthoquinone diazide | D-1 | 0.2 | | | 15 | | 4 | | 5 | | |
| sulfonic acid ester (D) | D-2 | | 5 | | | 5 | | 6 | | | |
| (parts by weight) | D-3 | | | 10 | | 5 | | | | | |
| Thermal initiator (E) | E-1 | | 3 | 3 | | | | 1 | | 3 | |
| (parts by weight) | E-2 | 1 | | 3 | | 10 | 0.2 | | | | |
| | E-3 | | | | 8 | | | 2 | | | |
| Solvent (F) | F-1 | 500 | 1500 | 1000 | 2000 | 1000 | 500 | 3000 | 1500 | 1000 | 1000 |
| (parts by weight) | F-2 | | | | | 500 | 500 | | | 500 | |
| Additive (G) Surfactant | G-1 | | 0.1 | | | | | | | | |
| (parts by weight) Development Adherence | G-2 | | | | 0.3 | | | | | | |
| Evaluation items | Resolution | ○ | ○ | ○ | ○ | ○ | ○ | ○ | ○ | X | X |
| | Development Adherence | ○ | ○ | ○ | ○ | ○ | ○ | ○ | X | ○ | X |

(the amounts of the components each is based on the alkali-soluble resin (A) of 100 parts by weight)

| Compounds | Names |
|---|---|
| B-1 | dipentaerythritol hexaacrylate |
| B-2 | dipentaerythritol tetraacrylate |
| B-3 | PO modified glycerol triacrylate |
| C-1 | phenylthiooctanediketonebenzoylbenzoyloxime[1-[4-(phenylthio)phenyl]-octane-1,2-dione 2-(O-benzoyloxime)] |
| C-2 | 2-methyl-1-[4-(methylthio) phenyl]-2-morpholino-1-propanone (manufactured by Ciba Specialty Chemicals) |
| C-3 | 4,4'-bis(diethylamino) benzophenone (manufactured by Ciba Specialty Chemicals) |
| D-1 | ortho-naphthoquinone diazide sulfonic acid ester formed from 4,4'-[1-[4[-1-(4-hydroxy phenyl)-1-methylethyl]phenyl]ethylene]bisphenol and ortho-naphthoquinone diazide-5-sulfonic acid |
| D-2 | ortho-naphthoquinone diazide sulfonic acid ester formed from 2,3,4-trihydroxybenzophenone and ortho-naphthoquinone diazide-5-sulfonic acid |
| D-3 | ortho-naphthoquinone diazide sulfonic acid ester formed from 2-(2,3,4-trihydroxyphenyl)-2-(2',3',4'-trihydroxyphenyl) propane and ortho-naphthoquinone diazide-5-sulfonic acid |
| E-1 | 2,2'-azobis(2,4-dimethylvaleromtnle) |
| E-2 | cumyl peroxyneodecanoate |
| E-3 | p-menthane hydroperoxide |
| F-1 | propylene glycol monomethyl ether acetate |
| F-2 | diethylene glycol dimethyl ether |
| G-1 | SF-8427 |
| G-2 | methoxyl 3-methacryloxypropyl trimethoxysilane |

What is claimed is:

1. A spacer with a pattern formed by subjecting a photosensitive resin composition to sequentially a pre-baking step, an exposing step, a developing step and a post-baking step, wherein the photosensitive resin composition comprises:
   an alkali-soluble resin (A);
   a compound (B) containing vinyl unsaturated group(s);
   a photoinitiator (C);
   ortho-naphthoquinone diazide sulfonic acid ester (D);
   a thermal initiator (E); and
   a solvent (F).

2. A protective film with a pattern formed by subjecting a photosensitive resin composition to sequentially a pre-baking step, an exposing step, a developing step and a post-baking step, wherein the photosensitive resin composition comprises:
   an alkali-soluble resin (A);
   a compound (B) containing vinyl unsaturated group(s);
   a photoinitiator (C);
   ortho-naphthoquinone diazide sulfonic acid ester (D);
   a thermal initiator (E); and
   a solvent (F).

3. A liquid crystal display device including the spacer of claim 1.

4. A liquid crystal display device including the protective film of claim 2.

5. The spacer of claim 1, wherein the alkali-soluble resin (A) is copolymerized from an unsaturated carboxylic acid monomer (a1), an unsaturated monomer containing epoxy group(s) (a2) and other unsaturated monomers (a3).

6. The spacer of claim 1, wherein based on the amount of the alkali-soluble resin (A) as 100 parts by weight, the usage amount of the compound (B) containing vinyl unsaturated group(s) is 20 parts by weight to 200 parts by weight, the usage amount of the ortho-naphthoquinone diazide sulfonic acid ester (D) is 0.2 parts by weight to 15 parts by weight, the usage amount of the thermal initiator (E) is 0.2 parts by weight to 10 parts by weight, and the usage amount of the solvent (F) is 500 parts by weight to 3000 parts by weight.

7. The spacer of claim 1, wherein based on the amount of the compound (B) containing vinyl unsaturated group(s) as 100 parts by weight, the amount of the photoinitiator (C) is 10 parts by weight to 80 parts by weight.

8. The spacer of claim 1, wherein the thermal initiator (E) is at least one selected from a group consisting of azo compounds, peroxides and hydrogen peroxide.

9. The protective film of claim 2, wherein the alkali-soluble resin (A) is copolymerized from an unsaturated carboxylic acid monomer (a1), an unsaturated monomer containing epoxy group(s) (a2) and other unsaturated monomers (a3).

10. The protective film of claim 2 wherein based on the amount of the alkali-soluble resin (A) as 100 parts by weight, the usage amount of the compound (B) containing vinyl unsaturated group(s) is 20 parts by weight to 200 parts by weight, the usage amount of the ortho-naphthoquinone diazide sulfonic acid ester (D) is 0.2 parts by weight to 15 parts by weight, the usage amount of the thermal initiator (F) is 0.2 parts by weight to 10 parts by weight, and the usage amount of the solvent (F) is 500 parts by weight to 3000 parts by weight.

11. The protective film of claim 2, wherein based on the amount of the compound (B) containing vinyl unsaturated group(s) as 100 parts by weight, the amount of the photoinitiator (C) is 10 parts by weight to 80 parts by weight.

12. The protective film of claim 2, wherein the thermal initiator (E) is at least one selected from a group consisting of azo compounds, peroxides and hydrogen peroxide.

\* \* \* \* \*